(12) United States Patent
Ichimura et al.

(10) Patent No.: US 7,670,430 B2
(45) Date of Patent: Mar. 2, 2010

(54) METHOD OF RECOVERING SODIUM METAL FROM FLUX

(75) Inventors: Mikiya Ichimura, Nagoya (JP); Katsuhiro Imai, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 12/221,642

(22) Filed: Aug. 5, 2008

(65) Prior Publication Data

US 2008/0302297 A1 Dec. 11, 2008

Related U.S. Application Data

(63) Continuation of application No. PCT/JP2006/326168, filed on Dec. 21, 2006.

(30) Foreign Application Priority Data

Feb. 13, 2006 (JP) ............................. 2006-035035

(51) Int. Cl.
*C30B 9/00* (2006.01)
*C30B 17/00* (2006.01)

(52) U.S. Cl. ...................... 117/73; 117/77; 117/81; 117/952

(58) Field of Classification Search ................ 117/73, 117/77, 81, 952
See application file for complete search history.

(56) References Cited

U.S. PATENT DOCUMENTS

| 6,177,057 | B1 * | 1/2001 | Purdy | .................. 423/409 |
|---|---|---|---|---|
| 6,592,663 | B1 | 7/2003 | Sarayama et al. | |
| 7,220,311 | B2 * | 5/2007 | Iwata et al. | .................. 117/73 |
| 7,531,038 | B2 * | 5/2009 | Sarayama et al. | ............. 117/73 |
| 2003/0164138 | A1 | 9/2003 | Sarayama et al. | |
| 2004/0134413 | A1 * | 7/2004 | Iwata et al. | .................. 117/2 |
| 2007/0175383 | A1 * | 8/2007 | Fukuda et al. | ................ 117/35 |
| 2007/0209575 | A1 | 9/2007 | Iwai et al. | |
| 2008/0081015 | A1 * | 4/2008 | Sarayama et al. | ........... 423/409 |
| 2008/0264331 | A1 * | 10/2008 | Iwata et al. | .................. 117/13 |
| 2008/0282971 | A1 * | 11/2008 | Iwai et al. | .................. 117/206 |
| 2008/0302297 | A1 * | 12/2008 | Ichimura et al. | ............. 117/73 |
| 2009/0000538 | A1 * | 1/2009 | Iwai et al. | .................. 117/19 |
| 2009/0000542 | A1 * | 1/2009 | Iwai et al. | .................. 117/206 |
| 2009/0038539 | A1 * | 2/2009 | Imai et al. | .................. 117/79 |
| 2009/0078193 | A1 * | 3/2009 | Imai et al. | .................. 117/71 |
| 2009/0095212 | A1 * | 4/2009 | Ichimura et al. | ............. 117/68 |

FOREIGN PATENT DOCUMENTS

| JP | 2001-102316 | 4/2001 |
| JP | 2002-68896 | 3/2002 |
| JP | 2002-293696 | 10/2002 |
| JP | 2003-292400 | 10/2003 |
| WO | 2005/095682 | 10/2005 |

\* cited by examiner

*Primary Examiner*—Robert M Kunemund
*Assistant Examiner*—G. Nagesh Rao
(74) *Attorney, Agent, or Firm*—Burr & Brown

(57) ABSTRACT

It is provided a method for gently and safely recovering only sodium metal from a flux containing sodium metal in a short time and in a reusable form. Flux 23 is heated in a medium 19 unreactive with sodium metal 22 at a temperature equal to or higher than the melting point of sodium metal to separate and recover the sodium metal 22 from the flux 23.

The medium is a hydrocarbon, for example.

4 Claims, 6 Drawing Sheets
(2 of 6 Drawing Sheet(s) Filed in Color)

METHOD OF RECOVERING SODIUM METAL FROM FLUX

FIELD OF THE INVENTION

The present invention relates to a method for recovering sodium metal from Na flux.

BACKGROUND OF THE INVENTION

Gallium nitride crystal, which is attracting attention as a material for excellent blue light emitting element, is put into practical use in light emitting diode field, and further just beginning to be put into practical use also as an optical pick-up blue-violet semiconductor laser element. It is known to use MOCVD method, HVPE method, ammonothermal method, Na flux method and the like to perform growth of gallium nitride single crystal. For example, methods for growing gallium nitride single crystal by the Na flux method are disclosed in Japanese Patent Publication Nos. 2002-293696A and 2003-292400A.

On the other hand, the present applicants disclosed a method for efficiently growing gallium nitride single crystal under a specific condition by use of a hot isostatic press (HIP) apparatus in WO 2005/095682 A1.

SUMMARY OF THE INVENTION

However, it is known that the crystal growth by flux method involves the following problem. Namely, after completion of growth of gallium nitride single crystal using Na flux, for example, sodium metal, Na—Ga stoichiometric alloy, a seed crystal substrate, the single crystal and further impurity crystal as occasion demands are left within a crucible. Therefore, excessive Na metal must be separated from the other residues within the crucible prior to recovery and treatment of the single crystal from the flux. Namely, the sodium metal is first discharged out of the crucible by being dissolved in ethanol or water, and the Na—Ga stoichiometric alloy and the single crystal are then taken out of the crucible and treated. However, since Na vigorously reacts with the water or ethanol in this treatment method, sodium metal cannot be recovered in a reusable form as flux raw material, in addition to generation of hydrogen or heat with the risk of firing. To avoid such generation of hydrogen or firing, the reaction must be slowly performed.

The present invention thus has an object to provide a method for gently and safely recovering only sodium metal from a flux containing sodium metal in a short time and in a reusable form.

The present invention provides a method of recovering sodium metal from a flux containing sodium metal: said method comprising the step of, heating said flux within a medium unreactive with the sodium metal at a temperature equal to or higher than the melting point of the sodium metal to separate and recover the sodium metal from the flux.

The present inventors found that sodium metal can be separated and recovered from the flux by heating the flux in the medium non-reactive with sodium metal at a temperature equal to or higher than the melting point of sodium metal. According to this method, sodium metal can be separated and recovered from the flux in a short time and in a reusable form without generation of hydrogen gas or heat.

BRIEF DESCRIPTION OF THE DRAWINGS

The patent or application filed contains at least one drawing executed in color. Copies of this patent or patent application publication with color drawing(s) will be provided by the Office upon request and payment of the necessary fee.

DETAILED DESCRIPTION OF THE INVENTION

The present invention will be described further in detail in reference to the drawings. Each drawing described below mainly relates to an example in which the present invention is applied for recovering sodium metal from a flux after growing a single crystal using Na flux method.

Figure 1:
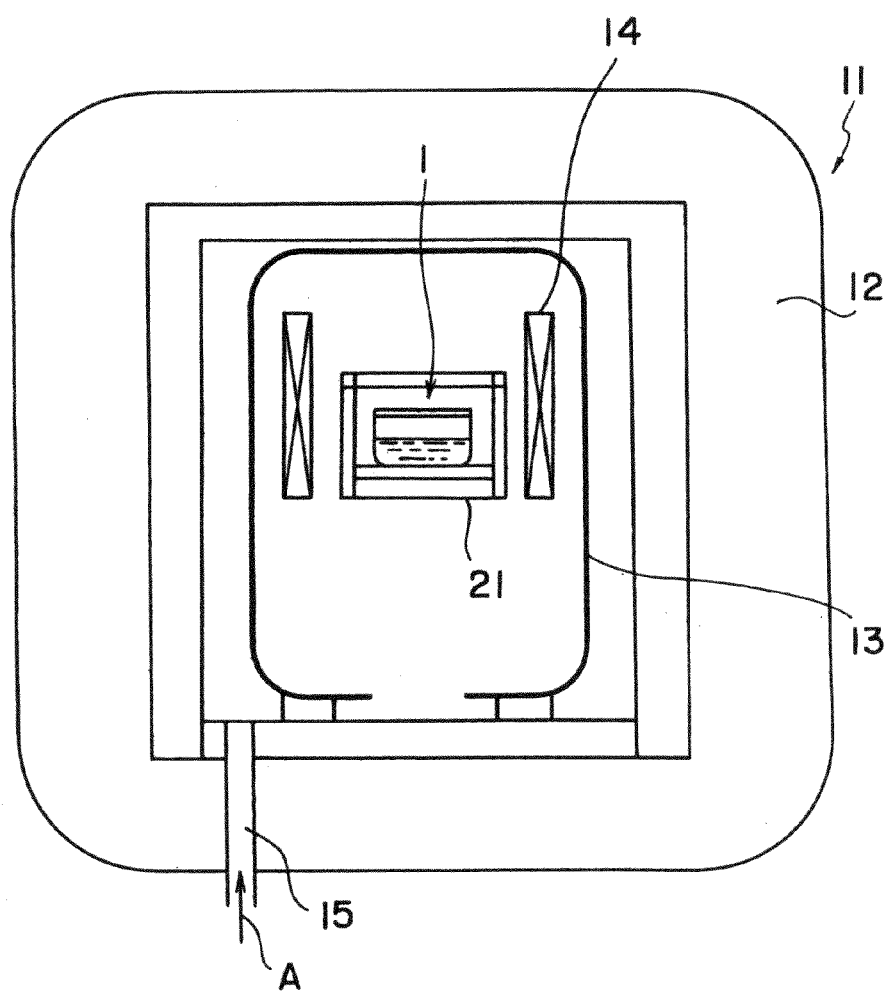
FIG. 1 is a schematic view, showing a state in which a growth vessel 1 is set within an HIP apparatus.
Figure 2:
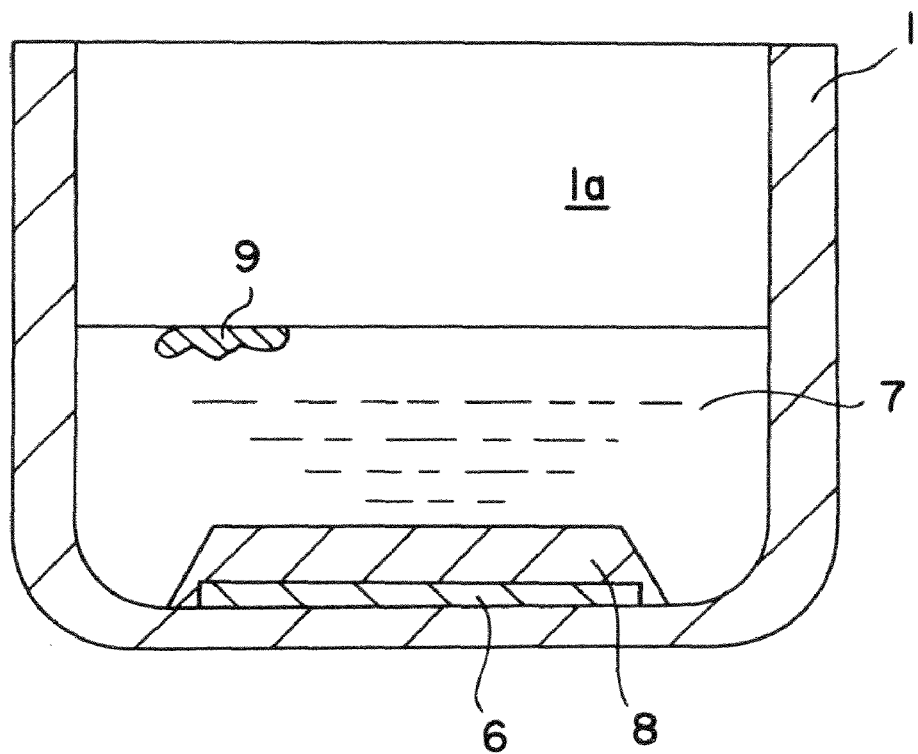
FIG. 2 is a sectional view, schematically showing a state where growth of single crystal is performed within the growth vessel 1.

Raw materials are charged into an internal space $1a$ of a growth vessel 1 in a non-oxidizing atmosphere within a glove box laid in the non-oxidizing atmosphere as shown in FIGS. 1 and 2. The growth vessel 1 may include a lid. A seed crystal substrate 6 is set on the bottom part of the growth vessel 1. The growth vessel 1 is encapsulated in an outer container 21 in this state, then taken out of the glove box, and set within a crystal growth apparatus as it is.

For example, in the example shown in FIG. 1, the outer container 21 and the growth vessel 1 are set within a pressure vessel 12 of an HIP (hot isostatic press) apparatus 11. A mixed gas cylinder not shown is provided on the outside of the pressure vessel 12. The mixed gas cylinder is filled with a mixed gas having a predetermined composition, and the mixed gas is compressed to a predetermined pressure by a compressor, and supplied into the pressure vessel 12 through a feed pipe 15 as shown by arrow A. Of this atmosphere, nitrogen is used as a nitrogen source, and an inert gas such as argon gas suppresses vaporization of the flux. The pressure of this atmosphere is monitored by a pressure gauge not shown. A heater 14 is set around the outer container 21 and the growth vessel 1, so that the growth temperature within the growth vessel 1 can be controlled.

When the growth vessel 1 is heated and pressurized within the outer container 21, mixed raw materials are entirely dissolved within the growth vessel 1 to form a flux 7. If a predetermined single crystal growth condition is retained therein, a single crystal film 8 grows over the seed crystal substrate 6 since nitrogen is supplied stably into the flux 7 from the internal space $1a$. However, the nitrogen supplied from the atmosphere $1a$ into the flux tends to disproportionately flow to the vicinity of the liquid level. Therefore, impurity crystal 9 tends to grow by multi-nucleation growth in the vicinity of the liquid level.

Figure 3:
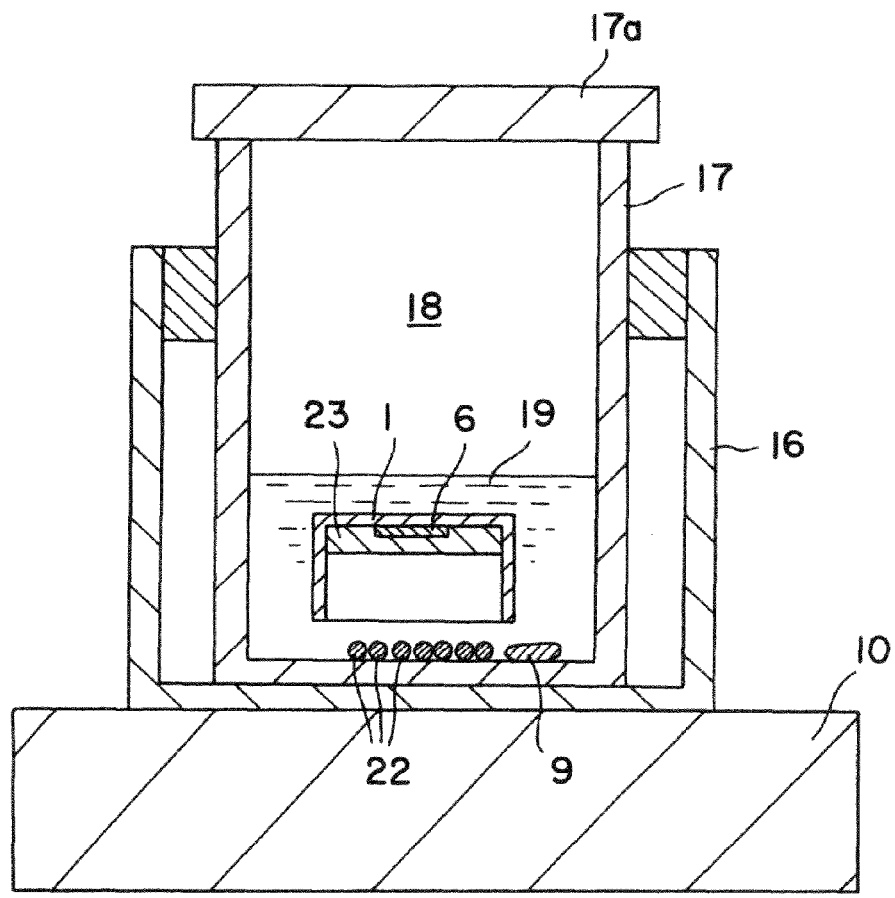
FIG. 3 is a schematic view, showing an apparatus for separating impurity crystal 9 and sodium metal 22 from a flux within the growth vessel 1.

After completion of the single crystal growth, the flux is cooled. In this state, a solidified flux 23 and the seed crystal substrate 6 having the single crystal film attached thereto are left within the growth vessel 1 as shown in FIG. 3. This flux contains sodium metal, an alloy of sodium with another metal and the impurity crystal. Conventionally, the sodium metal was dissolved by injecting water or ethanol to the growth vessel 1 in this state, and the sodium alloy, impurity crystal and seed crystal substrate were then taken out of the growth vessel 1. However, when water or ethanol is injected to the growth vessel 1, the sodium metal is vigorously reacted therewith to generate hydrogen and heat.

In the present invention, in contrast, the flux is heated within a medium 19 non-reactive with sodium metal at a temperature equal to or higher than the melting point of sodium metal. In the example of FIG. 3, for example, a container 16 is set on a hot plate 10, and a treatment vessel 17 is placed within the container 16. Denoted at 17a is a lid. The medium 19 non-reactive with sodium metal is injected into a space 18 within the treatment vessel 17, and the growth vessel 1 is immersed in the medium 19. When the growth vessel 1 is heated at the temperature equal to or higher than the melting point of sodium metal in this state, sodium metal 22 is separated into the medium 19, while the solidified flux 23 of sodium with another metal is left within the growth vessel 1. The impurity crystal 9 is also separated from the flux.

After separated from the flux, the sodium metal 22 and the impurity crystal 9 precipitate within the medium 19 or float therein. This behavior is determined depending on the densities of the sodium metal, impurity crystal and medium. Thereafter, the growth vessel 1 is taken out of the treatment vessel 17 to separate the solidified flux 23 from the seed crystal substrate 6, and the single crystal film is separated from the seed crystal substrate 6.

As the medium non-reactive with sodium metal, any gas or liquid which is substantially non-reactive with sodium metal at a heat treatment temperature can be used without any particular limitation. The non-reactivity with sodium metal means that substances other than sodium and the medium are not generated in contact with sodium.

Examples of such gas include an inert gas such as argon, helium or neon and a non-oxidizing gas such as nitrogen. As such liquid, both an inorganic material and an organic material can be used. Examples of the inorganic material include silicon oil. Examples of the organic compound include benzene and ether. Among them, hydrocarbon is preferably used, and an alkane compound is particularly preferably used. Such alkane compound may be a pure material or a mixture. As concrete examples thereof, kerosene, light oil, octane, decane and the like can be given.

The melting point of sodium metal is 98° C. at ordinary pressure. Accordingly, the heat treatment temperature of the flux must be 98° C. or higher. From the viewpoint of separation efficiency, the heat treatment temperature is preferably 100° C. or higher, further preferably 110° C. or higher. An excessively high heat treatment temperature tends to cause a problem such that the internal pressure of the treatment vessel 17 is raised by vaporization or decomposition of the medium, resulting in breakage of the treatment vessel 17. Therefore, the heat treatment temperature is preferably 200° C. or lower, further preferably 150° C. or lower.

The heat treatment time is such that sodium metal can be sufficiently separated from the flux, and is set preferably 3 minutes or more.

The heating method is not particularly limited, and an optional method such as hot plate, heater, or hot air can be used.

In the present invention, the kind of the nonoxidizing atmosphere during single crystal growth is not particularly limited and, for example, an inert gas atmosphere of nitrogen, argon or the like and a reducing atmosphere of carbon monoxide, hydrogen or the like are adaptable. However, the present invention is particularly suitable to a nitrogenous atmosphere. The nitrogenous atmosphere may be composed of only nitrogen, but may contain a nonoxidizing gas other than nitrogen, e.g. an inert gas such as argon or a reducing gas.

In the present invention, the apparatus for the single crystal growth is not particularly limited. Although a hot isostatic press apparatus is preferred as such apparatus, other atmospheric pressure heating furnaces are also usable.

To the flux, another metal such as lithium, calcium, potassium, rubidium, cesium, magnesium, strontium, barium or tin can be further added.

According to the present invention, growth of the following single crystals can be suitably performed: GaN, AlN, InN, mixed crystal thereof (AlGaInN), and BN.

The heating temperature and pressure in the single crystal growth are not particularly limited since they are selected depending on the kind of single crystal to be grown or the flux to be used. The heating temperature can be set, for example, to 800 to 1200° C. The upper limit thereof is not particularly regulated, but it can be set, for example, to 1500° C. or lower in the flux method. The pressure is not particularly regulated either, and is set preferably to 1 MPa or more, further preferably to 5 MPa or more from the viewpoint of suppressing vaporization of Na. The upper limit of the pressure is not particularly defined, but can be set, for example, to 200 MPa or less in the flux method.

The material of the treatment vessel 17 may be an airtight material having durability under an intended heating and pressurizing condition without any particular limitation. Examples of such material include glass, ceramic, aluminum, iron, and thermosetting resin.

Further concrete single crystals and growing procedures thereof will be now described.

(Growth Example of Gallium Nitride Single Crystal)

Gallium nitride single crystal can be grown using a flux containing at least sodium metal. A gallium raw material is mixed to the flux. As the gallium raw material, gallium single metal, a gallium alloy, and a gallium compound are applicable, and gallium single metal is suitably used from the viewpoint of handling.

The flux may contain a metal other than sodium, for example, lithium. Although the gallium raw material and the flux raw material such as sodium may be used in an appropriate proportion, excess use of Na is generally considered. This is, of course, not limitative.

In this embodiment, the growth of gallium single crystal is carried out under an atmosphere consisting of a mixed gas containing nitrogen gas at a total pressure of 30 MPa or more and 200 MPa or less. By setting the total pressure to 30 MPa or more, gallium single crystals of good quality could be grown, for example, in a high-temperature range of 900° C. or higher, further preferably in a high-temperature range of 950° C. or higher. This reason is not known exactly, but this may be attributable to that the nitrogen solubility is increased according to temperature rise, and nitrogen efficiently dissolves in the growing solution. When the total pressure of the atmosphere is set to 200 MPa or more, the density of the high-pressure gas significantly gets close to that of the growing solution, so it becomes unpreferably difficult to retain the growing solution within the crucible.

TABLE 1

Densities of various materials (g/cm³)

| | Sodium metal | Nitrogen | Argon |
|---|---|---|---|
| 800° C. · 1 atm | 0.75 | 0.0003 | 0.0004 |
| 927° C. · 300 atm | | 0.08 | 0.11 |
| 927° C. · 1000 atm | | 0.21 | 0.33 |
| 927° C. · 2000 atm | | 0.3 (speculated) | 0.5 (speculated) |

In a preferred embodiment, the nitrogen partial pressure in the atmosphere during growth is set to 10 MPa or more and 200 MPa or less. By setting the nitrogen partial pressure to 10 MPa or more, gallium nitride single crystals of good quality could be grown in a high-temperature range of, for example, 1000° C. or higher while promoting the dissolution of nitrogen to the flux. From this point of view, the nitrogen partial pressure in the atmosphere is set further preferably to 20 MPa or more. The nitrogen partial pressure is set also preferably to 100 MPa or less from the practical point of view.

Although the gas other than nitrogen in the atmosphere is not particularly limited, an inert gas is preferred, and argon, helium or neon is particularly preferred. The partial pressure of the gas other than nitrogen corresponds to a value obtained by subtracting the nitrogen gas partial pressure from the total pressure.

In a preferred embodiment, the growth temperature of gallium nitride single crystal is set to 950° C. or higher, further preferably to 1000° C. or higher, and even in such a high-temperature range, gallium nitride single crystals of good quality can be grown. In addition, the growth at high temperature is possible, which can possibly improve the productivity.

Although the upper limit of the growth temperature of gallium nitride single crystal is not particularly defined, an excessively high growth temperature makes the crystal growth difficult. Therefore, the growth temperature is set preferably to 1500° C. or lower. From this viewpoint, the temperature is set further preferably to 1200° C. or lower.

As the material of the growth substrate for epitaxially growing the gallium nitride crystal, for example, sapphire, AlN template, GaN template, silicon single crystal, SiC single crystal, MgO single crystal, spinel ($MgAl_2O_4$), and perovskite composite oxide such as $LiAlO_2$, $LiGaO_2$, $LaAlO_3$, $LaGaO_3$, or $NdGaO_3$ can be given, although the material is not particularly limited thereto. A cubic perovskite structure composite oxide represented by the composition formula $[A_{1-y}(Sr_{1-x}Ba_x)_y][(Al_{1-z}Ga_z)_{1-u}D_u]O_3$ (wherein A is a rare earth element; D is one or more elements selected from the group consisting of niobium and tantalum; y=0.3 to 0.98; x=0 to 1; z=0 to 1; u=0.15 to 0.49; and x+z=0.1 to 2) is also usable. Further, SCAM ($ScAlMgO_4$) is also usable.

(Growth Example of AlN Single Crystal)

The present invention could be confirmed to be also effective for growth of AlN single crystal by pressurizing a melt including a flux containing at least aluminum and sodium in a specific condition under a nitrogenous atmosphere.

EXAMPLES

Experiment 1

Figure 4:
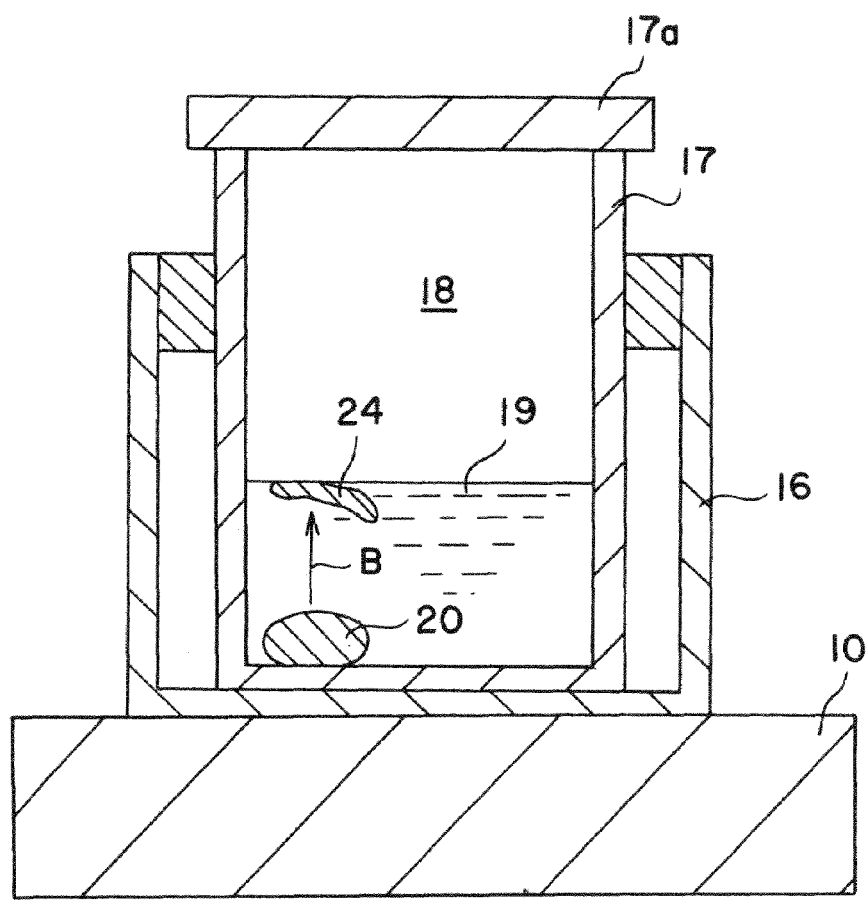
FIG. 4 is a schematic view, showing an apparatus used in a preliminary experiment to separate sodium oxide 22 from sodium metal 20.

As a preliminary experiment, a mass of sodium metal the surface of which was oxidized was immersed in kerosene. Concretely, a container 16 was set on a hot plate 10 as shown in FIG. 4, and a treatment vessel 17 was placed within the container 16. Denoted at 17a is a lid. Kerosene 19 that is a medium non-reactive with sodium metal was injected into a space 18 within the treatment vessel 17. The surface-oxidized sodium metal was immersed in the kerosene. The vessel in this state was heated to 130° C., and retained at 130° C. for 30 minutes. As a result, sodium oxide 24 floated in the vicinity of the liquid level of the kerosene 19 as shown by arrow B, while the sodium metal 20 remained sunken on the bottom of the kerosene 19.

Figure 5:
FIG. 5 is a photographic image showing separation of sodium oxide from sodium metal in Experiment 1.

FIG. 5 is a photographic image showing this state. The mass of sodium metal 20 with metallic luster was sunk on the bottom of a glass vessel, and a sheath 24 of sodium oxide floated near the liquid level of kerosene.

Experiment 2

Growth of GaN single crystal was carried out using an apparatus as shown in FIG. 1. The flux was then treated based on the method of the present invention to separate sodium metal.

Concretely, sodium metal 1 g and metal gallium 1 g were weighted within a glove box. As the seed crystal substrate 6, an AlN template substrate was used. The substrate 6 was horizontally placed on the bottom of a crucible 1 so that the single crystal thin film of the template faced upward. The AlN template is a template obtained by forming an AlN single crystal epitaxial thin film on a sapphire single crystal substrate.

After setting the flux raw materials, heating and pressurizing to 1000° C. and 60 MPa were performed in one hour using nitrogen gas, and the resulting vessel was retained at 1000° C. for 100 hours. The growth vessel was then allowed to naturally cool to room temperature. The resulting growth vessel was set within the treatment vessel 17 as shown in FIG. 3. The treatment vessel 17 contained kerosene so that the growth vessel 1 was immersed in the kerosene. The temperature was raised to 130° C., and retained at that temperature for 30 minutes. As a result, sodium metal 22 was separated from the flux and recovered.

Figure 6:
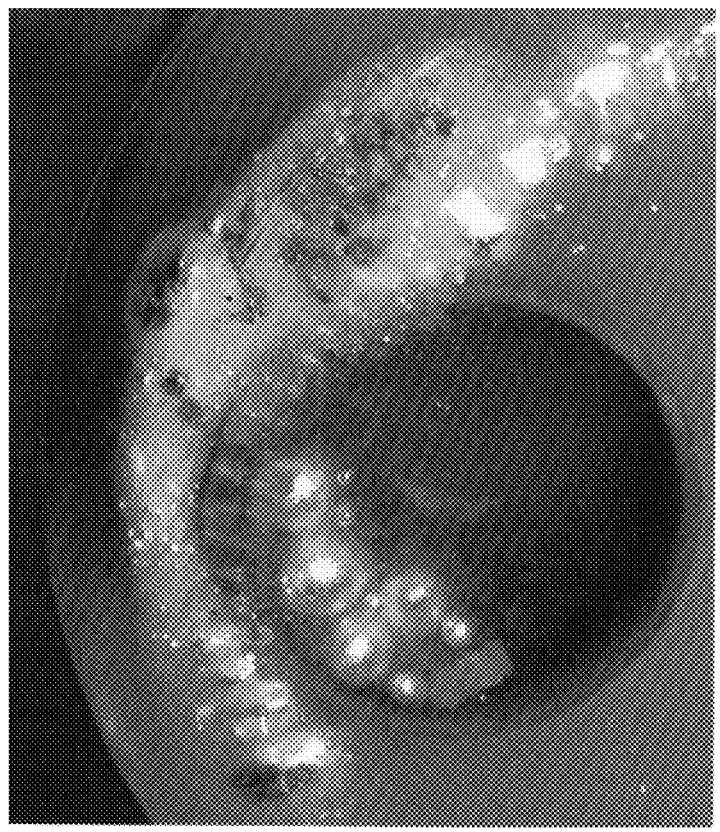
FIG. 6 is a photographic image showing sodium metal and impurity crystal separated from a flux in Experiment 2.

The weight of the recovered sodium metal was 0.6 g which corresponds to 90% of a theoretical recovery value. As shown in FIG. 6, the sodium metal 22 with metallic luster is separated along the edge of the growth vessel 1. It is also found from FIG. 6 that the impurity crystal 9 is separated on the upper side. Since the melting point of Na—Ga stoichiometric alloy is as high as 498 to 558° C., the alloy is never dissolved by heat treatment such that sodium metal is melted, and left within the growth vessel 1 as solid. Since it takes about 1 day to remove the sodium using ethanol, the time required for the treatment can be significantly shortened by this method.

Thereafter, the remaining Ga was removed by immersing the growth vessel 1 in diluted hydrochloric acid to thereby take out a GaN single crystal 8. The GaN single crystal 8 had a thickness of about 1 mm and was substantially colorless and transparent.

While specific embodiments have been shown and described, the present invention is never limited by these specific embodiments, and can be carried out with various modifications and substitutions without departing from the spirit and scope of the invention.

The invention claimed is:

1. A method of recovering sodium metal from a flux containing sodium metal, the method comprising the step of:
heating said flux in a medium unreactive with said sodium metal at a temperature equal to or higher than the melting point of said sodium metal to separate and recover said sodium metal from said flux, wherein said medium comprises an organic compound, and wherein said medium is liquid at a temperature of said heating.

2. The method of recovering sodium metal from a flux of claim 1, wherein after a single crystal is grown in said flux, the sodium metal is separated from the flux.

3. The method of recovering sodium metal from a flux of claim 2, wherein said single crystal comprises a nitride single crystal.

4. The method of recovering sodium metal from a flux of claim 1, wherein said medium comprises a hydrocarbon.

* * * * *